United States Patent [19]

Miyamoto

[11] Patent Number: 5,340,769
[45] Date of Patent: Aug. 23, 1994

[54] METHOD FOR MANUFACTURING SEMICONDUCTOR DEVICE HAVING GROOVE-STRUCTURED ISOLATION

[75] Inventor: Hidenobu Miyamoto, Tokyo, Japan

[73] Assignee: Nec Corporation, Tokyo, Japan

[21] Appl. No.: 157,538

[22] Filed: Nov. 26, 1993

[30] Foreign Application Priority Data

Nov. 26, 1992 [JP] Japan .................. 4-317004

[51] Int. Cl.⁵ .............................. H01L 21/76
[52] U.S. Cl. ...................... 437/67; 437/52; 437/63; 148/DIG. 50
[58] Field of Search ............ 437/67, 63, 52; 148/DIG. 50

[56] References Cited

U.S. PATENT DOCUMENTS 4,981,812 1/1991 Nishizaka ............... 437/52
5,208,179 5/1993 Okazawa ............... 437/67

FOREIGN PATENT DOCUMENTS 0267963 11/1990 Japan ................... 437/67

OTHER PUBLICATIONS

T. Nishizaka et al: "32 Mbit Very High Density Mask ROM", NEC Res. & Develop., vol. 32, No. 1, Jan. 1991, pp. 48–51.

*Primary Examiner*—Tom Thomas
*Assistant Examiner*—Trung Dang
*Attorney, Agent, or Firm*—Sughrue, Mion, Zinn, Macpeak & Seas

[57] ABSTRACT

A conductive layer is formed on a semiconductor substrate, and is etched so that a side face of the conductive layer is reversely-tapered. Also, a sidewall insulating layer is formed on the side face of the conductive layer. Then, a groove is formed within the semiconductor substrate with a mask of the sidewall insulating layer, and an isolation insulating layer is buried within the groove.

10 Claims, 13 Drawing Sheets

METHOD FOR MANUFACTURING SEMICONDUCTOR DEVICE HAVING GROOVE-STRUCTURED ISOLATION

BACKGROUND OF THE INVENTION

1. Field of the Invention

The present invention relates to a method for manufacturing a semiconductor device such as a mask read-only memory (ROM).

2. Description of the Related Art

A mask ROM is composed of a memory portion and its peripheral portion. Also, in the peripheral portion, isolation between elements is carried out by a thick field insulating layer obtained by a so-called local oxidation of silicon (LOCOS), while in the memory portion, isolation between elements is carried out by a groove (trench) configuration (see: T. Nishizaka et al: "32 Mbit Very High Density Mask ROM", NEC Res. & Develop., Vol 32, No. 1, January 1991, pp 48–51).

In a prior art method for manufacturing a memory portion of mask ROM, a conductive layer made of polycrystalline silicon, for example, is formed on a semiconductor substrate. Then, the conductive layer is etched, and a groove is formed within the semiconductor substrate where the conductive layer is removed. Then, an isolation insulating layer made of boron phosphorus silicate glass (BPSG) is buried within the groove, which will be explained later in more detail.

In the above-mentioned prior art method, however, a side face of the conductive layer is perpendicular or forward-tapered. If the side face of the conductive layer is perpendicular, voids may be easily generated within the buried isolation insulating layer, thus deteriorating the reliability of the mask ROM. On the one hand, if the side face of the conductive layer is forward-tapered, voids may be hardly generated within the buried isolation insulating layer. In this case, however, even when anisotropic etching is performed upon the conductive layer, such etching is incomplete, i.e., the portion of the forward-tapered conductive layer remains, thus inviting a short-circuit.

SUMMARY OF THE INVENTION

It is an object of the present invention to provide an improved groove configuration for an isolation insulating layer in a semiconductor device such as a mask ROM.

According to the present invention, a conductive layer is formed on a semiconductor substrate, and is etched so that a side face of the conductive layer is reversely-tapered. Also, a sidewall insulating layer is formed on the side face of the conductive layer. Then, a groove is formed within the semiconductor substrate with a mask of the sidewall insulating layer, and an isolation insulating layer is buried within the groove. Thus, since the side face of the conductive layer is reversely-tapered, no remaining layer is found after an anisotropic etching of the conductive layer. Also, since a side face of the sidewall facing the isolation insulating layer can be forward-tapered, no voids are generated in the isolation insulating layer.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of embodiments of the present invention, a prior art method for manufacturing a semiconductor device will be explained with reference to FIG. 1A through 1F and FIG. 2. Note that reference X designates a memory portion of a mask ROM, and Y designate a peripheral portion of the mask ROM (see: the abovementioned document).

Figure 1A:
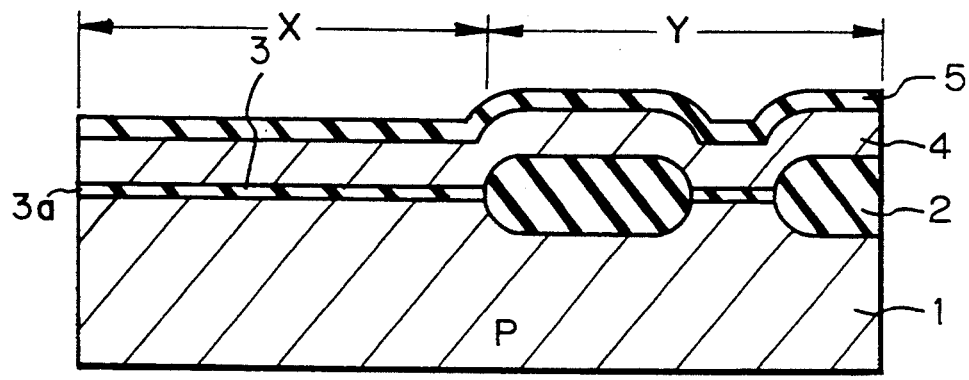
FIGS. 1A through 1F are cross-sectional views illustrating a prior art method for manufacturing a semiconductor device.

As illustrated in FIG. 1A, an about 800 nm thick field insulating layer 2 is grown by thermally oxidizing a P-type monocrystalline silicon substrate 1 for the peripheral portion Y. Also, an about 20 nm thick gate oxide layer 3 is grown by thermally oxidizing the silicon substrate 1. Next, an about 300 nm thick phosphorus-doped N+-type polycrystalline silicon layer 4 is deposited on the entire surface by a chemical vapor deposition (CVD) process, and also, an about 350 nm thick mask silicon dioxide layer 5 is deposited on the entire surface by a CVD process.

Figure 1B:
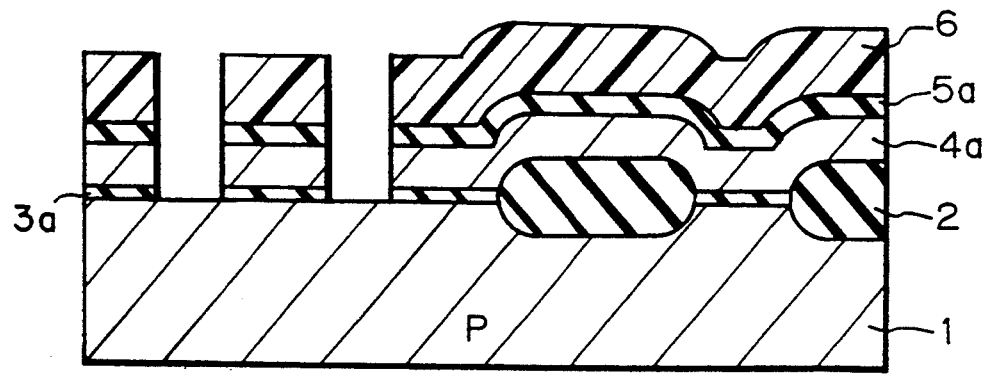

Next, as illustrated in FIG. 1B, a photoresist pattern layer 6 is formed. Then, the mask silicon dioxide layer 5, the polycrystalline silicon layer 4 and the gate oxide layer 3 are anisotropically etched with a mask of the photoresist pattern layer 6. In this case, the mask silicon dioxide layer 5, the polycrystalline silicon layer 4 and the gate oxide layer 3 are changed into their corresponding layers 5a, 4a and 3a, respectively. Note that a side face of the polycrystalline silicon layer 4a is perpendicular or forward-tapered.

Figure 1C:
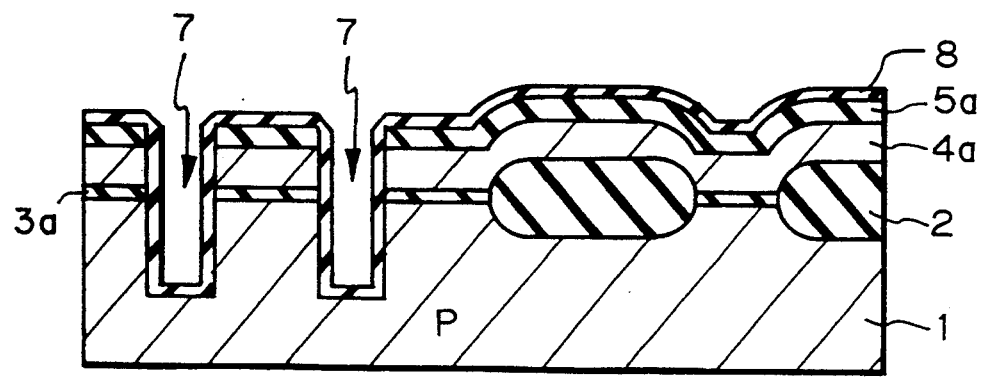

Next, as illustrated in FIG. 1C, the photoresist pattern layer 6 is removed. After that, the silicon substrate 1 is anisotropically etched with a mask of the mask silicon dioxide layer 5a, to thereby create a groove 7. Subsequently, a non-doped high temperature silicon oxide (HTO) layer 8 is deposited on the entire surface by a high temperature CVD process.

Figure 1D:
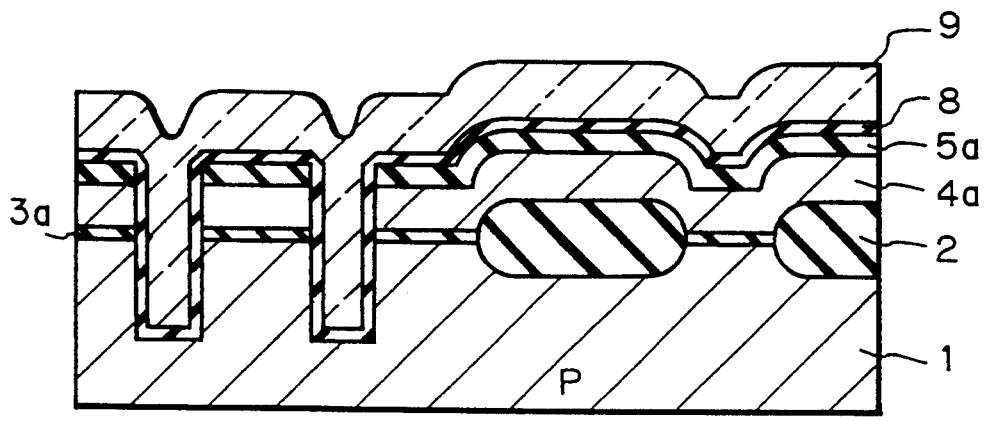

Next, as illustrated in FIG. 1D, a boron-included phosphorus silicate glass (BPSG) layer 9 is deposited. Then, a heat treatment is performed upon the BPSG layer 9, to reflow it.

Figure 1E:
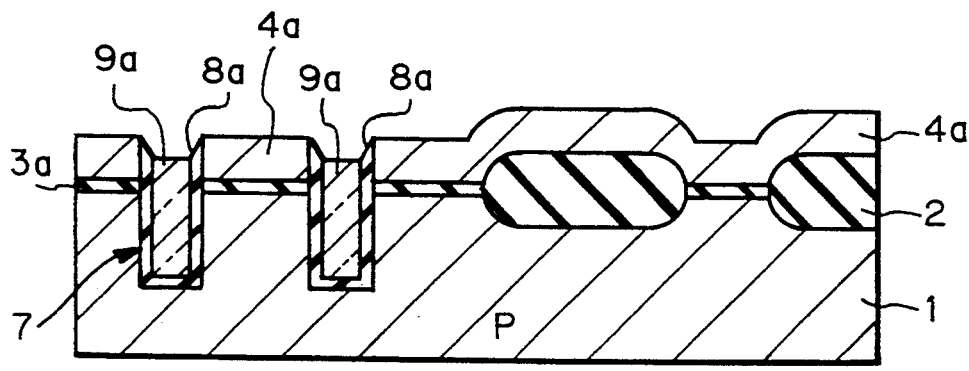

Next, as illustrated in FIG. 1E, the BPSG layer 9, the HTO layer 8 and the mask silicon dioxide layer 5a are etched back until the polycrystalline silicon layer 4a is completely exposed. As a result, a reminder 9a of the BPSG layer 9 as well as a reminder 8a of the HTO layer 8 are left in the groove 7.

Figure 1F:
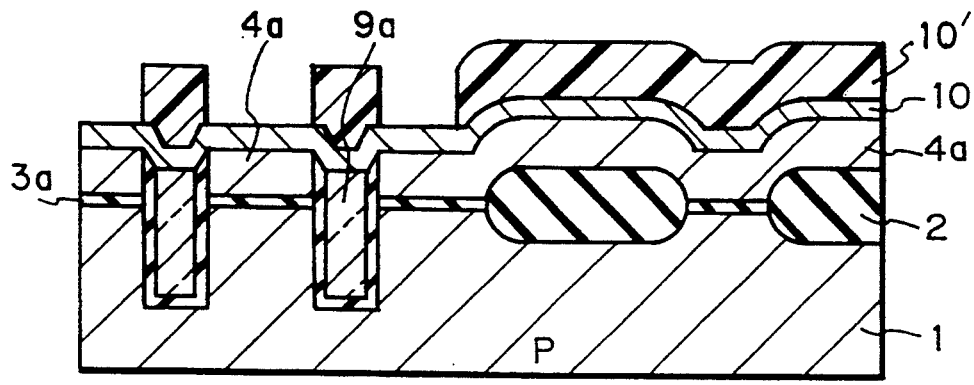

Next, as illustrated in FIG. 1F, a tungsten silicide layer 10 is deposited on the entire surface. Then, a photoresist pattern layer 10' corresponding to word lines is formed.

Figure 2:
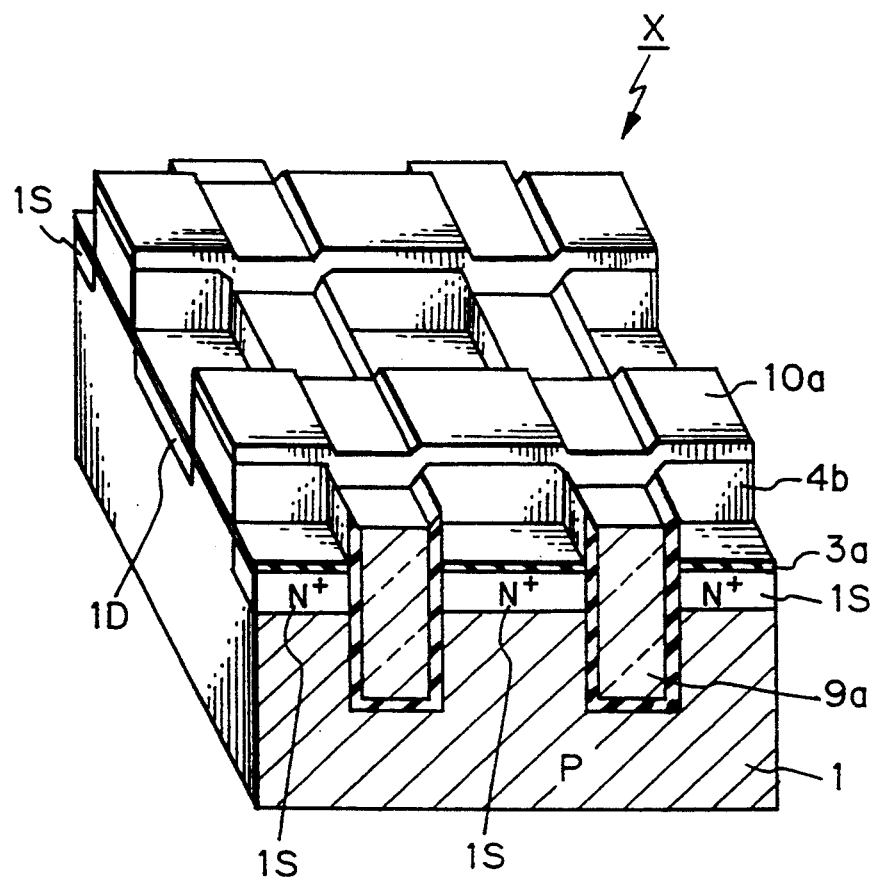
FIG. 2 is a perspective view of the semiconductor device obtained by the manufacturing steps as illustrated in FIGS. 1A through 1F.

Finally, as illustrated in FIG. 2, which shows only the memory portion X, the tungsten silicide layer 10 and the polycrystalline silicon layer 4a are anisotropically etched with a mask of the photoresist pattern layer 10'. As a result, the tungsten silicide layer 10 and the polycrystalline silicon layer 4a are changed into their corresponding layers 10a and 4b, respectively. Then, after the photoresist pattern layer 10' is removed, N-type impurities such as arsenate ions or phosphorus ions are implanted into the silicon substrate 1, to thereby create a source region 1S and a drain region 1D within the silicon substrate 1.

In the mask ROM obtained by the manufacturing steps as illustrated in FIGS. 1A through 1F and FIG. 2, however, a side face of the polycrystalline silicon layer 4a (4b) is perpendicular or forward-tapered.

Figure 3:
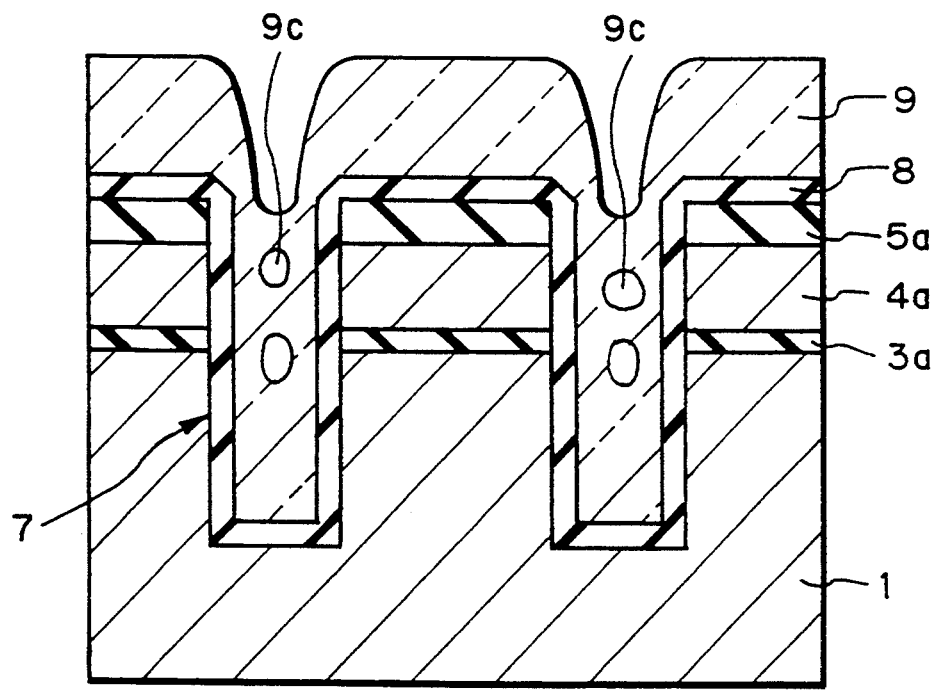
FIG. 3 and FIGS. 4A and 4B are cross-sectional views explaining the problems caused by the manufacturing steps as illustrated in FIGS. 1A through 1F and FIG. 2.

For example, as illustrated in FIG. 3, which is a partial enlargement of FIG. 1D, if the side face of the polycrystalline silicon layer 4a is perpendicular, voids 9c are easily generated in the BPSG layer 9 within the groove 7, thus deteriorating the reliability of the mask ROM.

Figure 4A:
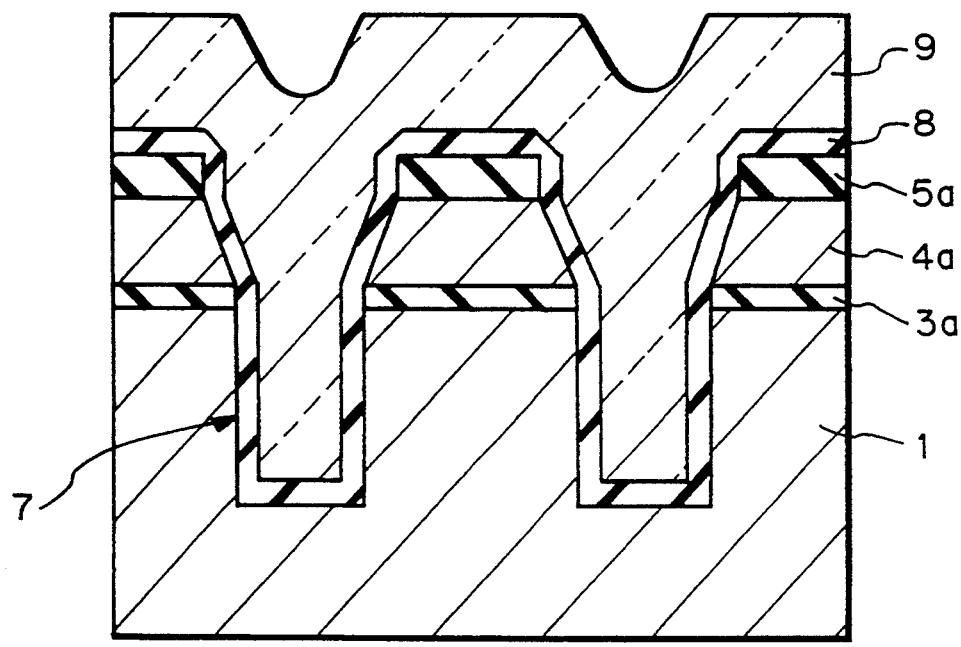
Figure 4B:
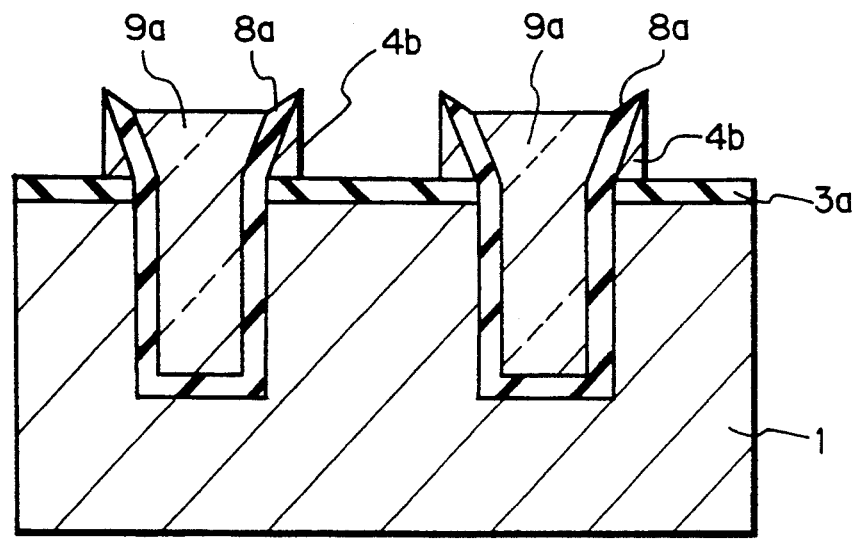

Also, as illustrated in FIG. 4A, which is also a partial enlargement of FIG. 1D, if the side face of the polycrystalline silicon layer 4a is forward-tapered, no voids may be generated in the BPSG layer 9 within the groove 7. In this case, however, when the tungsten silicide layer 10 and the polycrystalline silicon layer 4a are anisotropically etched, a remainder 4b of the polycrystalline silicon layer 4a may be present as illustrated in FIG. 4B. This reminder 4c may invite a short-circuit between the word lines formed by the polycrystalline silicon layer 4b (see: FIG. 2).

A first embodiment of the present invention will now be explained with reference to FIGS. 5A through 5H.

Figure 5A:
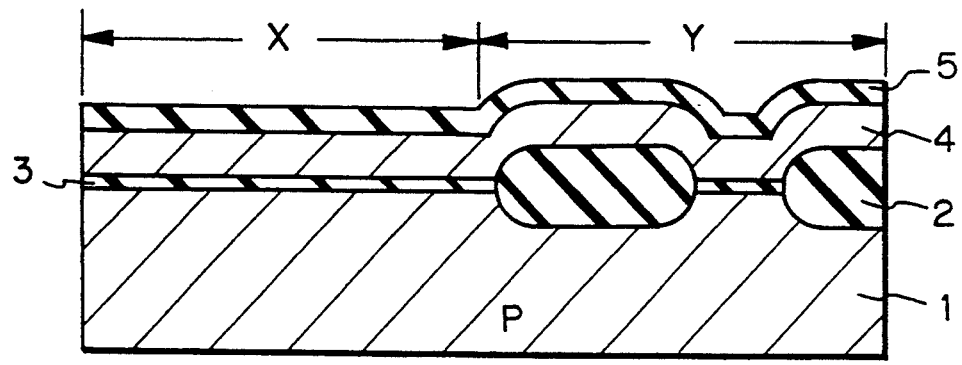
FIGS. 5A through 5H are cross-sectional views illustrating a method for manufacturing a semiconductor device according to a first embodiment of the present invention.

As illustrated in FIG. 5A, which is the same as FIG. 1A, an about 800 nm thick field insulating layer 2 is grown by thermally oxidizing a P-type monocrystalline silicon substrate 1 for the peripheral portion Y. Also, an about 20 nm thick gate oxide layer 3 is grown by thermally oxidizing the silicon substrate 1. Next, an about 300 nm thick phosphorus-doped N+-type polycrystalline silicon layer 4 is deposited on the entire surface by a CVD process, and also, an about 350 nm thick mask silicon dioxide layer 5 is deposited on the entire surface by a CVD process.

Figure 5B:
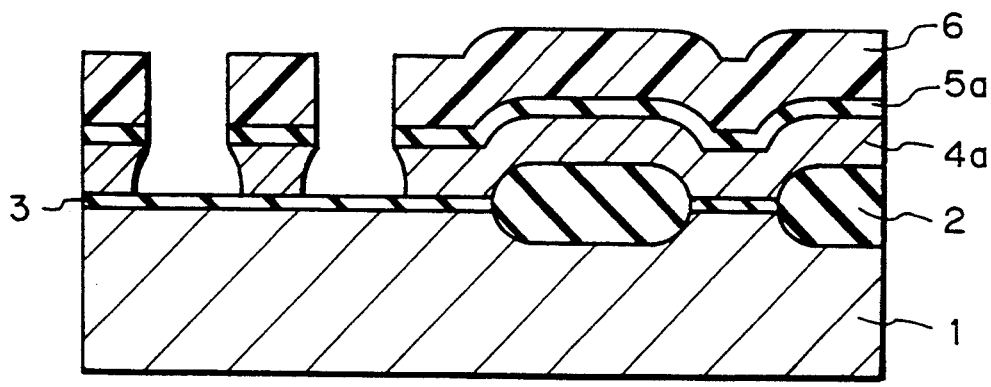

Next, as illustrated in FIG. 5B, a photoresist pattern layer 6 is formed. Then, the mask silicon dioxide layer 5 and the polycrystalline silicon layer 4 are anisotropically etched with a mask of the photoresist pattern layer 6. That is, the mask silicon dioxide layer 5 is etched by plasma gas of $CF_4$, $CHF_3$ and Ar on the condition that $CF_4$:$CHF_3$:Ar=70 sccm:50 sccm:1000 sccm; the gas pressure is 1200 mTorr; and the RF power is 750 W, thus creating a mask silicon dioxide layer 5a. Also, the polycrystalline silicon layer 4 is etched by plasma gas of $CCl_2F_2$ and $N_2$ on the condition that $CCl_2F_2$:$N_2$=50 sccm:12 sccm; the gas pressure is 18 Pa; and the RF power is 800 W, thus creating a polycrystalline silicon layer 4a. In this case, a side face of the polycrystalline silicon layer 4a is reversely-tapered.

Figure 5C:
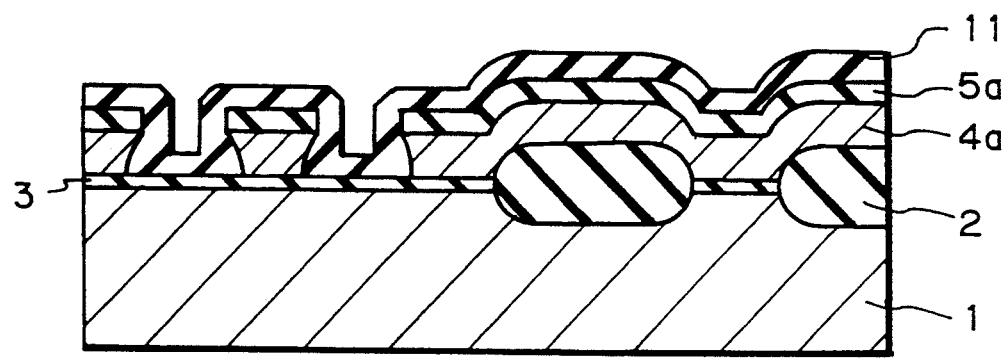

Next, as illustrated in FIG. 5C, the photoresist pattern layer 6 is removed. Then, an about 150 nm thick non-doped high temperature silicon oxide (HTO) layer 11 is deposited by a high temperature CVD process.

Figure 5D:
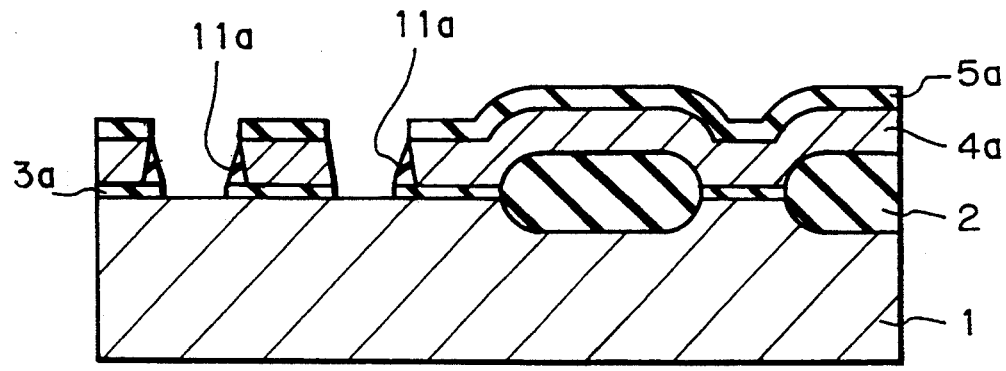

Next, as illustrated in FIG. 5D, the HTO layer 11 is etched back by plasma gas of $CF_4$, $CHF_3$ and Ar on the condition that $CF_4$:$CHF_3$:Ar=50 sccm:50 sccm:1000 sccm; the gas pressure is 1200 mTorr; and the RF power is 400 W, thus creating a sidewall oxide layer 11a. Simultaneously, the gate oxide layer 3 is etched, so that the gate oxide layer 3 is changed into its corresponding layer 3a.

Note that a side face of the sidewall oxide layer 11a is forward-tapered.

Figure 5E:
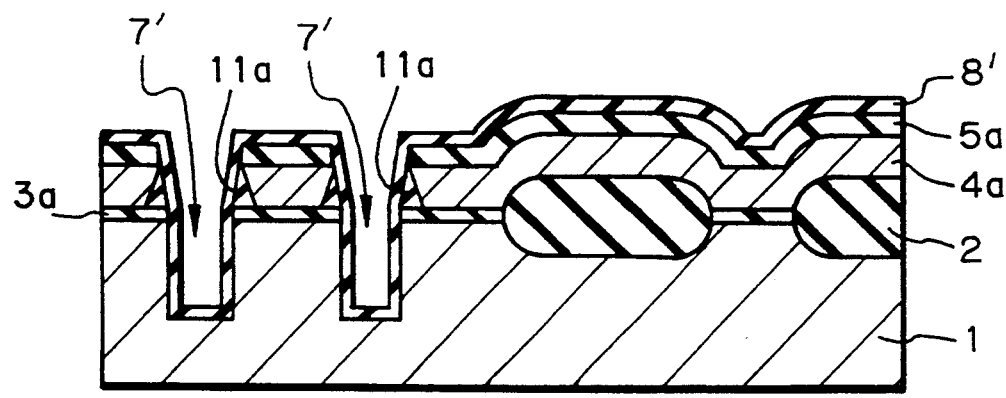

Next, as illustrated in FIG. 5E, the silicon substrate 1 is anisotropically etched with a mask of the mask silicon dioxide layer 5a and the sidewall oxide layer 11a by plasma gas of $Cl_2$ and $N_2$ on the condition that $Cl_2$:$N_2$=10 sccm:40 sccm; the gas pressure is 3 Pa; and the RF power is 600 W. Thus, a groove 7' is created. Subsequently, an about 100 nm thick boron silicate glass (BSG) layer 8' is deposited on the entire surface.

Figure 5F:
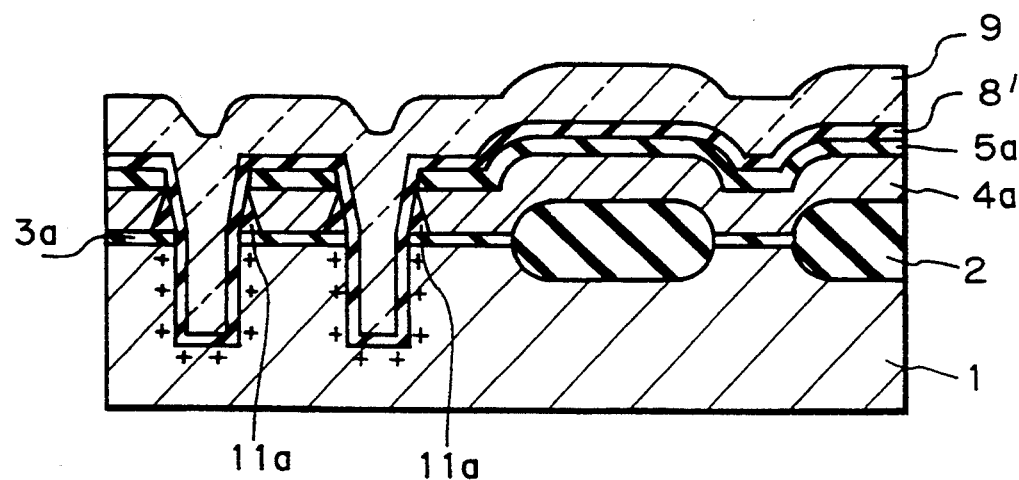

Next, as illustrated in FIG. 5F, a boron-included phosphorus silicate glass (BPSG) layer 9 is deposited. Then, a heat treatment is performed upon the BPSG layer 9, to reflow it.

When a reflowing operation is performed upon the BPSG layer 9, the surface of the BPSG layer 9 becomes smooth, and simultaneously, a P-type channel stopper is formed on the surface of the silicon substrate 1 adjacent to the groove 7' and beneath the sidewall oxide layer 11a.

In this case, since the sidewall oxide layer 11a has a forward-tapered face for the BPSG layer 9, voids are hardly generated in the BPSG layer 9.

Figure 5G:
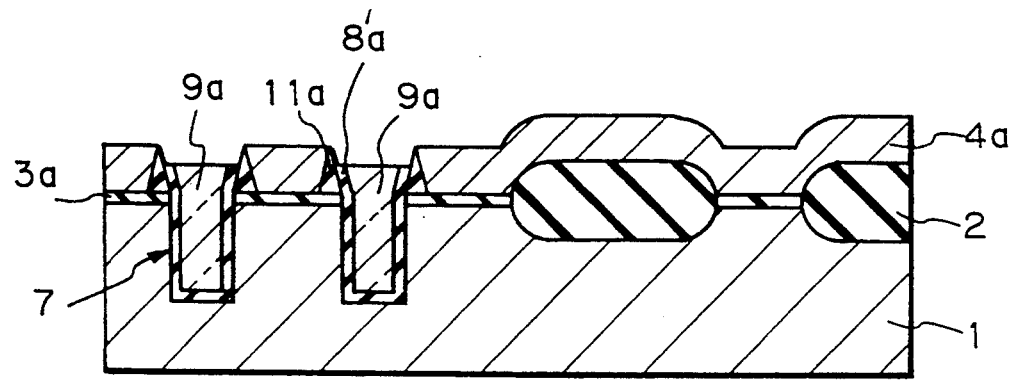

Next, as illustrated in FIG. 5G, the BPSG layer 9, the BSG layer 8' and the mask silicon dioxide layer 5a are etched back by plasma gas of $CF_4$, $CHF_3$ and Ar on the condition that $CF_4$:$CHF_3$:Ar=50 sccm:50 sccm:1000 sccm; the gas pressure is 2 mTorr; and the RF power is 750 W, until the polycrystalline silicon layer 4a is completely exposed. As a result, a remainder 9a of the BPSG layer 9 as well as a remainder 8'a of the BSG layer 8' are left in the groove 7'.

Figure 5H:
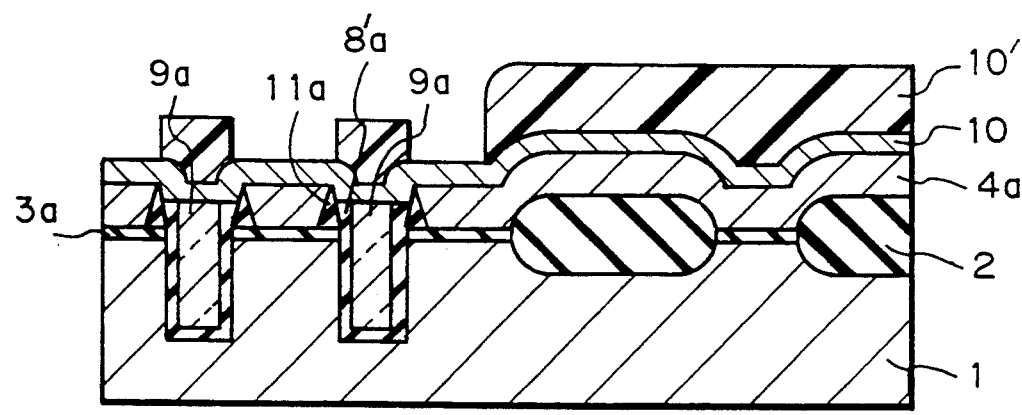

Next, as illustrated in FIG. 5H, an about 150 nm thick tungsten silicide layer 10 is deposited on the entire surface. Subsequently, a photoresist pattern layer 10' corresponding to word lines is formed. After that, the tungsten silicide layer 10 and the polycrystalline silicon layer 4a are anisotropically etched with a mask of the photoresist pattern layer 10'. As a result, the tungsten silicide layer 10 and the polycrystalline silicon layer 4a are changed into their corresponding layers 10a and 4b, respectively, Then, after the photoresist pattern layer 10' is removed, N-type impurities such as $1 \times 10^{16}$ arsenate ions per square cm are implanted into the silicon substrate 1, to thereby create a source region 1S and a drain region 1D within the silicon substrate 1 (see: FIG. 2).

In the first embodiment, as illustrated in FIG. 1F, the sidewall oxide layer 9a has a forward-tapered side face for the polycrystalline silicon layer 4a, no remainder (see: 4b of FIG. 4B) of the polycrystalline silicon layer 4a is present even after the anisotropic etching thereof, thus avoiding a short-circuit between the adjacent word lines.

A second embodiment of the present invention will be explained next with reference to FIGS. 6A through 6K.

Figure 6A:
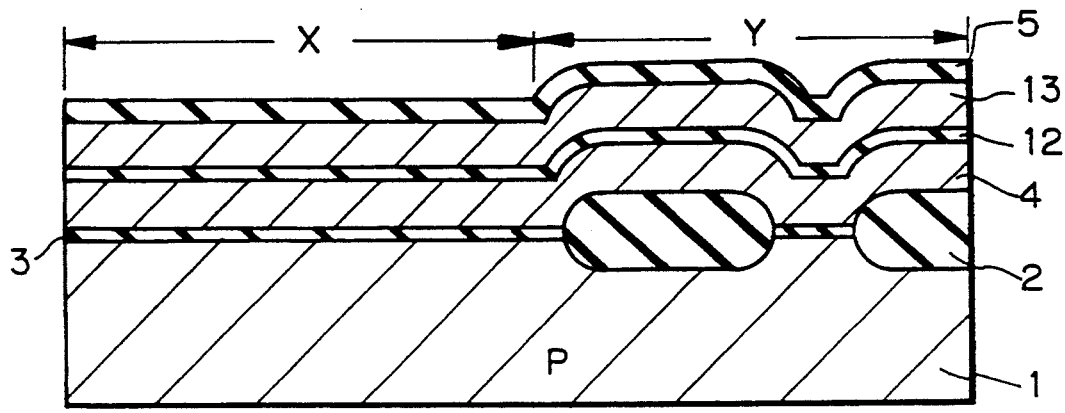
FIGS. 6A through 6K are cross-sectional views illustrating a method for manufacturing a semiconductor device according to a second embodiment of the present invention.

As illustrated in FIG. 6A, which corresponds to FIG. 5A, an about 800 nm thick field insulating layer 2 is grown by thermally oxidizing a P-type monocrystalline silicon substrate 1 for the peripheral portion Y. Also, an about 20 nm thick gate oxide layer 3 is grown by thermally oxidizing the silicon substrate 1. Next, an about 300 nm thick phosphorus-doped N+-type polycrystalline silicon layer 4 is deposited on the entire surface by a CVD process.

Further, a silicon dioxide layer 12 having a predetermined thickness and a polycrystalline silicon layer having a predetermined thickness are deposited on the entire surface. This process is not shown in FIG. 5A.

Then, an about 350 nm thick mask silicon dioxide layer 5 is deposited on the entire surface by a CVD process.

Figure 6B:
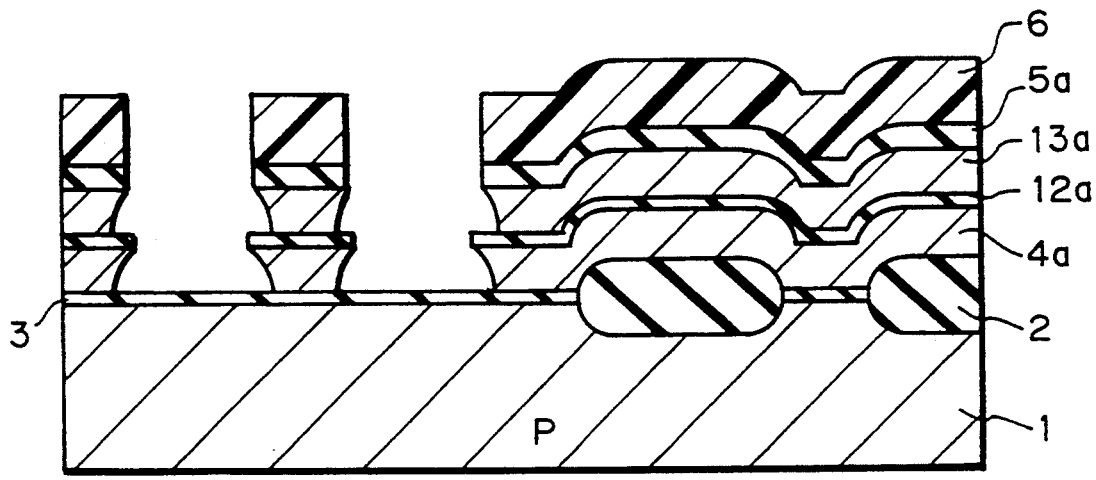

Next, as illustrated in FIG. 6B, which corresponds to FIG. 5B, a photoresist pattern layer 6 is formed. Then, the mask silicon dioxide layer 5, the polycrystalline silicon layer 13, the silicon dioxide layer 12 and the polycrystalline silicon layer 4 are anisotropically etched with a mask of the photoresist pattern layer 6. That is, the mask silicon dioxide layer 5 and the silicon dioxide layer 12 are etched by plasma gas of $CF_4$, $CHF_3$ and Ar on the condition that $CF_4:CHF_3:Ar=70$ sccm:50 sccm:1000 sccm; the gas pressure is 1200 mTorr; and the RF power is 750 W, thus creating mask silicon dioxide layer 5a and a silicon dioxide layer 12a, respectively. Also, the polycrystalline silicon layers 13 and 4 are etched by plasma gas of $CCl_2F_2$ and $N_2$ on the condition that $CCl_2F_2:N_2=50$ sccm:12 sccm; the gas pressure is 18 Pa; and the RF power is 800 W, thus creating a polycrystalline silicon layers 13a and 4a, respectively. In this case, a side face of the polycrystalline silicon layer 13a and a side face of the polycrystalline silicon layer 4a are both reversely-tapered.

Figure 6C:
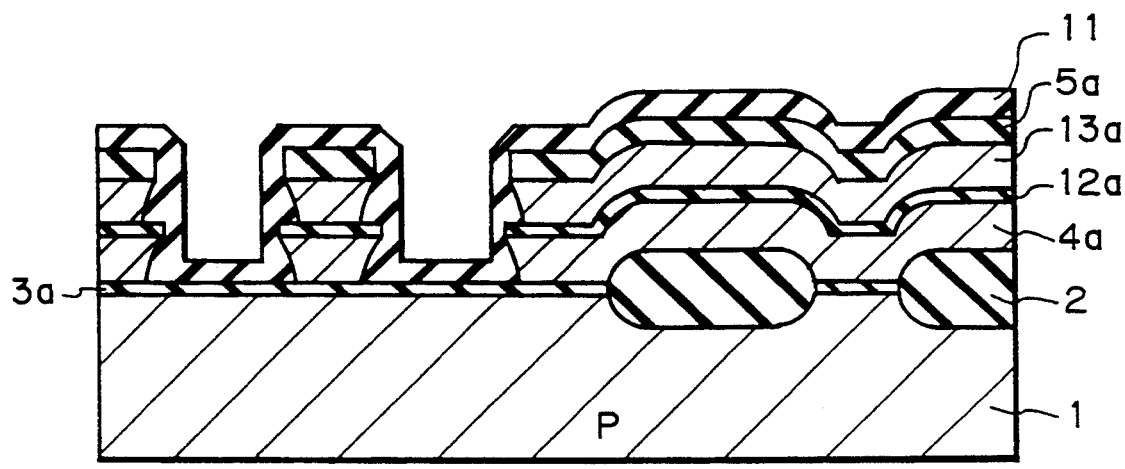

Next, as illustrated in FIG. 6C, which corresponds to FIG. 5C, the photoresist pattern layer 6 is removed. Then, an about 150 nm thick non-doped high temperature silicon oxide (HTO) layer 11 is deposited by a high temperature CVD process.

Figure 6D:
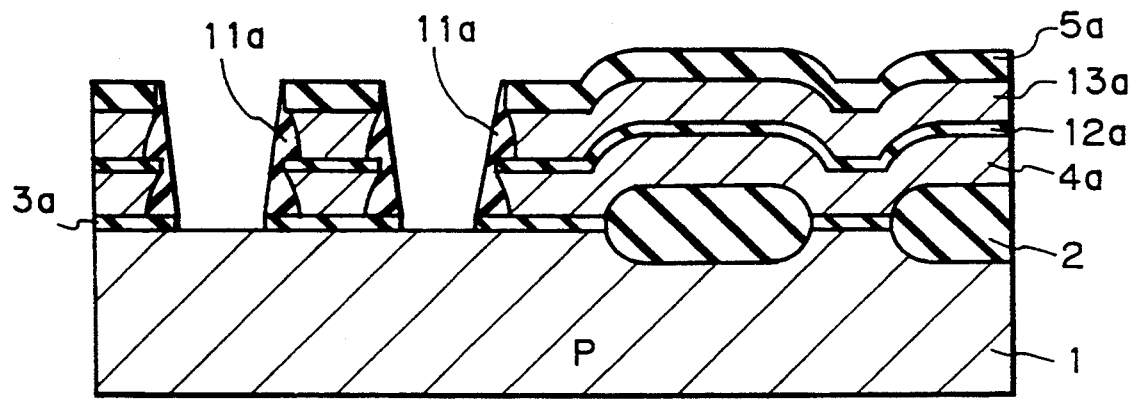

Next, as illustrated in FIG. 6D, which corresponds to FIG. 5D, the HTO layer 11 is etched back by plasma gas of $CF_4$, $CHF_3$ and Ar on the condition that $CF_4:CHF_3:Ar=50$ sccm:50 sccm:1000 sccm; the gas pressure is 1200 mTorr; and the RF power is 400 W, thus creating a sidewall oxide layer 11a. Simultaneously, the gate oxide layer 3 is etched, so that the gate oxide layer 3 is changed into its corresponding layer 3a.

Note that a side face of the sidewall oxide layer 11a is also forward-tapered.

Figure 6E:
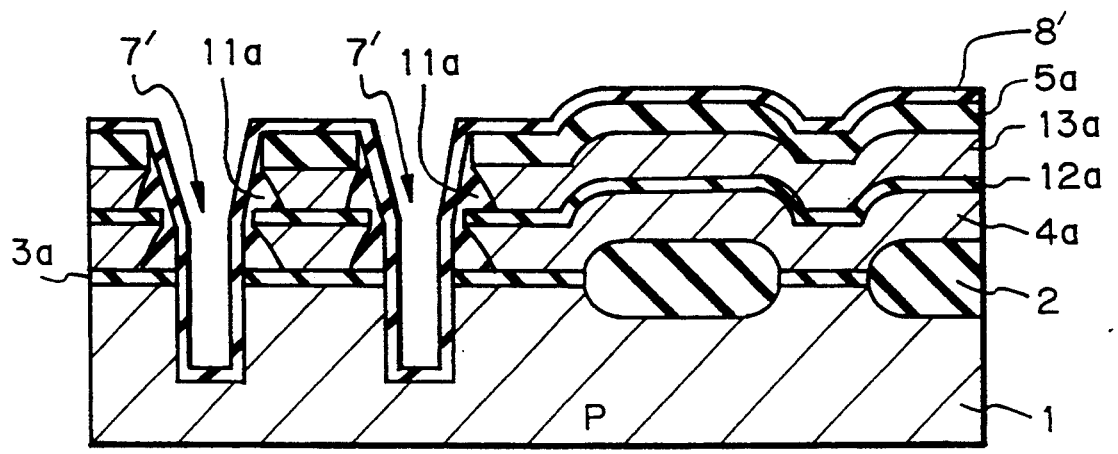

Next, as illustrated in FIG. 6E, which corresponds to FIG. 5E, the silicon substrate 1 is anisotropically etched with a mask of the mask silicon dioxide layer 5a and the sidewall oxide layer 11a by plasma gas of $Cl_2$ and $N_2$ on the condition that $Cl_2:N_2=10$ sccm:40 sccm; the gas pressure is 3 Pa; and the RF power is 600 W. Thus, a groove 7' is created. Subsequently, an about 100 nm thick BSG layer 8' is deposited on the entire surface.

Figure 6F:
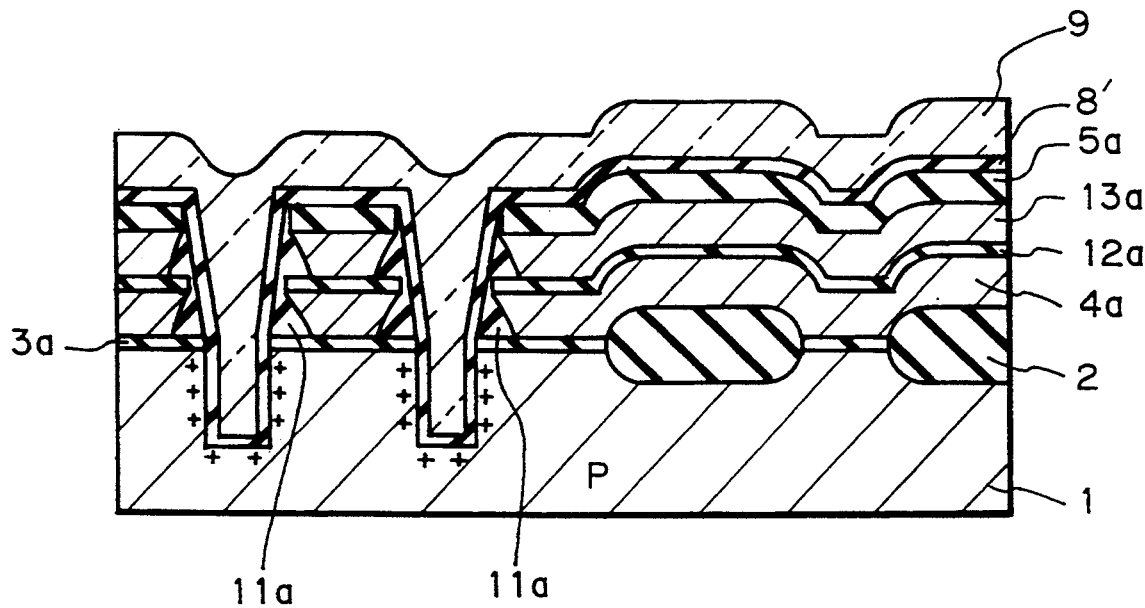

Next, as illustrated in FIG. 6F, which corresponds to FIG. 5F, a BPSG layer 9 is deposited. Then, a heat treatment is performed upon the BPSG layer 9, to reflow it.

When a reflowing operation is performed upon the BPSG layer 9, the surface of the BPSG layer 9 becomes smooth, and simultaneously, a P-type channel stopper is formed on the surface of the silicon substrate 1 adjacent to the groove 7' and beneath the sidewall oxide layer 11a.

Also, in this case, since the sidewall oxide layer 11a has a forward-tapered face for the BPSG layer 9, voids are hardly generated in the BPSG layer 9.

Figure 6G:
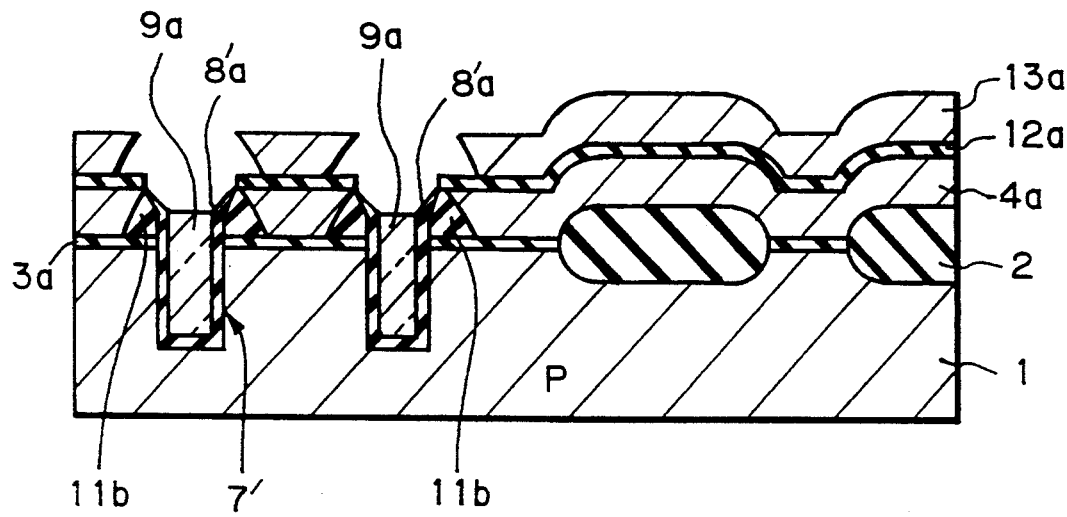

Next, as illustrated in FIG. 6G, which corresponds to FIG. 5G, the BPSG layer 9, the BSG layer 8', the mask silicon dioxide layer 5a and the sidewall oxide layer 11a are etched back by plasma gas of $CF_4$, $CHF_3$ and Ar on the condition that $CF_4:CHF_3:Ar=50$ sccm:50 sccm:1000 sccm; the gas pressure is 2 mTorr; and the RF power is 750 W, until the polycrystalline silicon layer 12a is completely exposed. As a result, a remainder 9a of the BPSG layer 9 as well as a remainder 8'a of the layer 8' are left in the groove 7'.

Figure 6H:
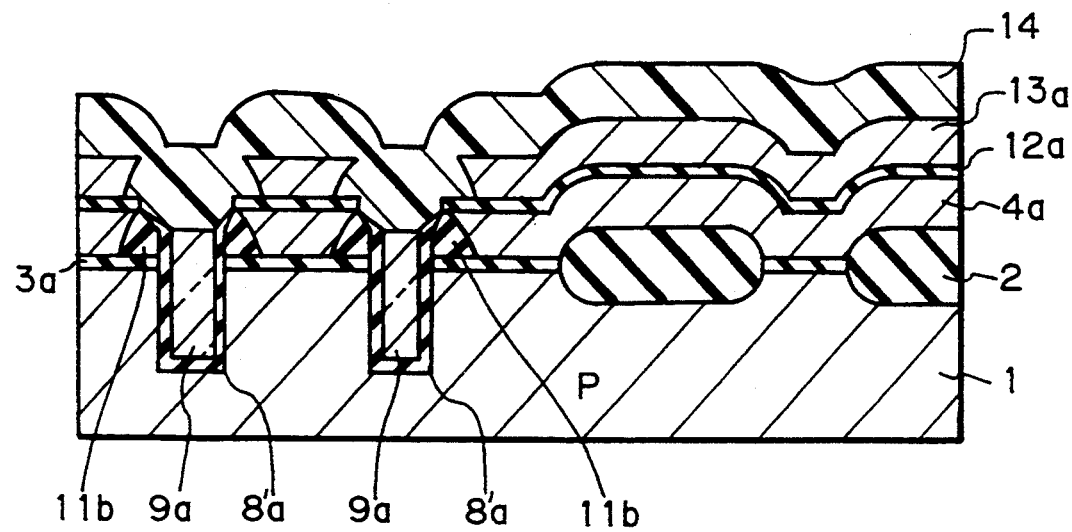
Figure 6:
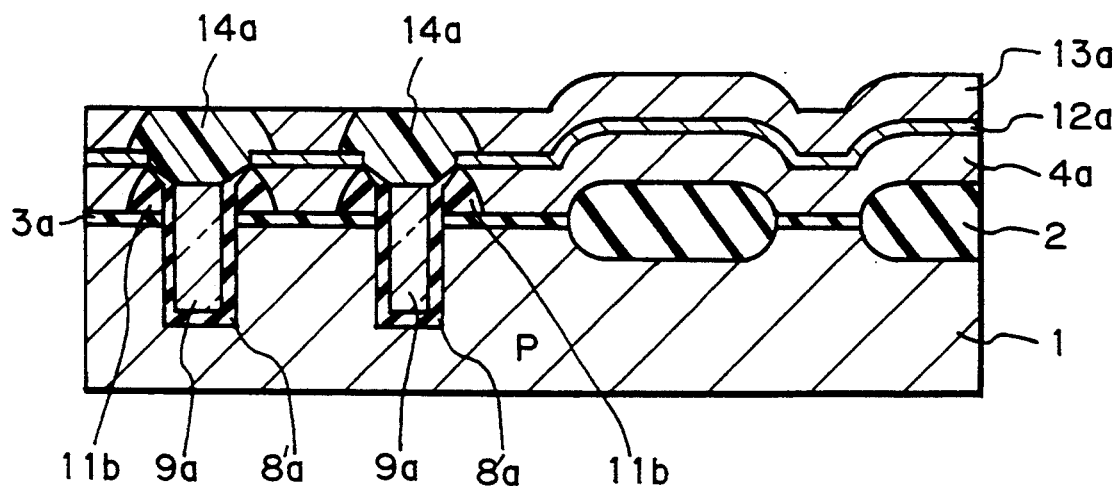

Next, as illustrated in FIG. 6H, a photoresist layer 14 is coated on the entire surface.

Next, as illustrated in FIG. 6I, the photoresist layer 14 is etched back. As a result, the photoresist layer 14 is changed into a photoresist pattern layer 14a which covers the BPSG layer 9a, the PSG layer 8'a and the sidewall oxide layer 11b.

Figure 6J:
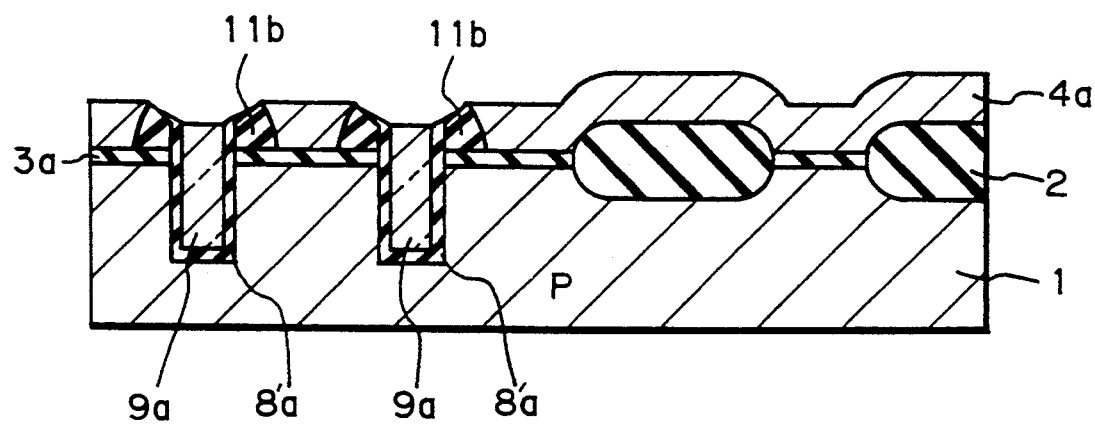

Next, as illustrated in FIG. 6J, the polycrystalline silicon layer 13a and the silicon dioxide layer 12a are etched with a mask of the photoresist pattern layer 14a. Then, the photoresist pattern layer 4a is removed.

Figure 6K:
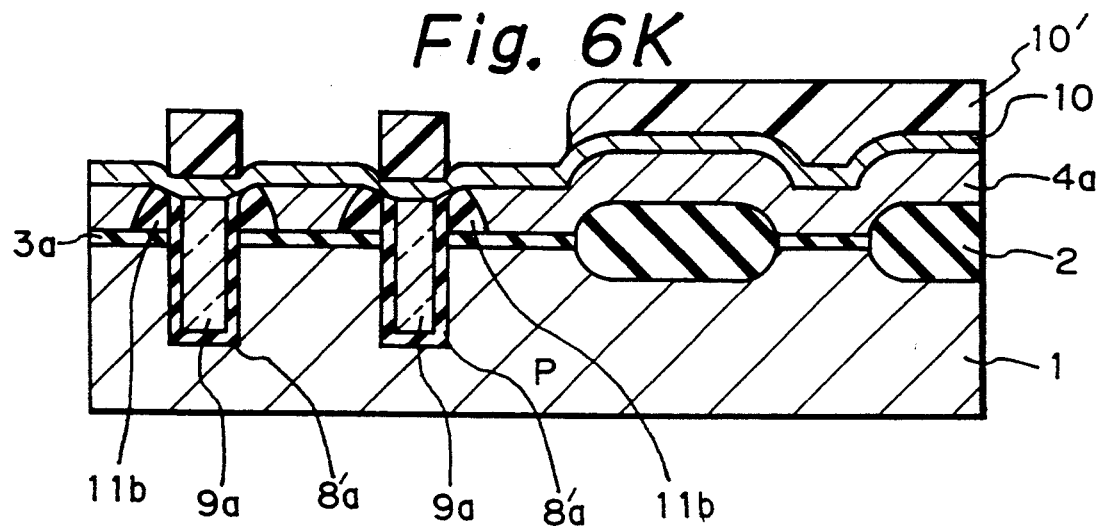

Next, as illustrated in FIG. 6K, which corresponds to FIG. 5H, an about 150 nm thick tungsten silicide layer 10 is deposited on the entire surface. Subsequently, a photoresist pattern layer 10' corresponding to word lines is formed. After that, the tungsten silicide layer 10 and the polycrystalline silicon layer 4a are anisotropically etched with a mask of the photoresist pattern layer 10'. As a result, the tungsten silicide layer 10 and the polycrystalline silicon layer 4a are changed into their corresponding layers 10a and 4b, respectively. Then, after the photoresist pattern layer 10' is removed, N-type impurities such as $1 \times 10^{16}$ arsenate ions per square cm are implanted into the silicon substrate 1, to thereby create a source region 1S and a drain region 1D within the silicon substrate 1 (see: FIG. 2).

In addition to the effect of the first embodiment, according to the second embodiment, since the polycrystalline silicon layer 13a serves as an etching stopper for the etching back operation of the BPSG layer 9 (see: FIGS. 6F and 6G), the margin of the etching back operation can be enhanced. Also, since the additional elements, i.e., the silicon dioxide layer 12 (12a) and the polycrystalline silicon layer 13 (13a), which are removed after the etching back of the BPSG layer 9, protect the polycrystalline silicon layer 4a from being damaged by plasma gas, the thickness of the polycrystalline silicon layer 4a is not reduced.

As explained hereinbefore, according to the present invention, since voids are hardly generated in the insulating layer filled within the groove, the reliability of the semiconductor device (mask ROM) can be improved. Also, since an etching operation performed upon the conductive layer for word lines is complete, a short-circuit between the word lines can be avoided.

I claim:

1. A method for manufacturing a semiconductor device, comprising the steps of:

forming a gate insulating layer on a semiconductor substrate of a first conductivity type;

forming a first conductive layer on said gate insulating layer;

forming a mask insulating layer on said first conductive layer;
forming a photoresist pattern layer on said mask insulating layer;
etching said mask insulating layer and said first conductive layer with a mask of said photoresist pattern layer, so that a side face of said first conductive layer is reversely-tapered;
removing said photoresist pattern layer;
forming a sidewall insulating layer on a side face of said mask insulating layer and said first conductive layer simultaneously with removing a part of said gate insulating layer where said first conductive layer and said sidewall insulating layer are not located;
etching said semiconductor substrate with a mask of said mask insulating layer and said sidewall insulating layer, to create a groove within said semiconductor substrate;
burying an isolation insulating layer within said groove;
forming a second conductive layer on said isolation insulating layer and said first conductive layer;
etching said first and second conductive layers with a predetermined pattern mask; and
introducing impurities of a second conductive type opposite to the first conductive type into said semiconductor substrate, to create a source region and a drain region within said semiconductor substrate.

2. A method as set forth in claim 1, wherein said first conductive layer is made of polycrystalline silicon.

3. A method as set forth in claim 1, wherein said sidewall insulating layer forming step includes the steps of:
forming a non-doped silicon dioxide layer on said mask insulating layer and said first conductive layer; and
etching back said non-doped silicon dioxide layer and said gate insulating layer.

4. A method as set forth in claim 1, wherein said isolation insulating layer forming step includes the steps of:
forming a silicate glass layer on said mask insulating layer, said sidewall insulating layer, and said semiconductor substrate within said groove;
forming a phosphorus-doped silicate glass layer on said silicate glass layer;
reflowing said phosphorus-doped silicate glass layer by a heat treatment; and
etching said silicate glass layer and said phosphorus-doped silicate glass layer, so that said first conductive layer is exposed.

5. A method as set forth in claim 1, wherein said second conductive layer is made of high melting temperature metal silicide.

6. A method for manufacturing a semiconductor device, comprising the steps of:
forming a first insulating layer formed on a semiconductor substrate of a first conductivity type;
forming a first conductive layer on said first insulating layer;
forming a second insulating layer on said first conductive layer;
forming a second conductive layer on said second insulating layer;
forming a third insulating layer on said second conductive layer;
forming a photoresist pattern layer on said third insulating layer;
etching said third insulating layer, said second conductive layer, said second insulating layer and said first conductive layer with a mask of said photoresist pattern layer, so that a side face of said second conductive layer and a side face of said first conductive layer are reversely-tapered;
removing said photoresist pattern layer;
forming a sidewall insulating layer on a side face of said third insulating layer, said second conductive layer, said second insulating layer and said first conductive layer simultaneously while removing a part of said first insulating layer where said first conductive layer and said sidewall insulating layer are not located;
etching said semiconductor substrate with a mask of said third insulating layer and said sidewall insulating layer, to create a groove within said semiconductor substrate;
burying an isolation insulating layer within said groove;
removing said second conductive layer and said second insulating layer;
forming a third conductive layer on said isolation insulating layer and said first conductive layer;
etching said first and second conductive layers with a predetermined pattern mask; and
introducing impurities of a second conductive type opposite to the first conductive type into said semiconductor substrate, to create a source region and a drain region within said semiconductor substrate.

7. A method as set forth in claim 6, wherein said first and second conductive layers are made of polycrystalline silicon.

8. A method as set forth in claim 6, wherein said sidewall insulating layer forming step includes the steps of:
forming a non-doped silicon dioxide layer on said third insulating layer, said second conductive layer, said second insulating layer and said first conductive layer; and
etching back said non-doped silicon dioxide layer and said first insulating layer.

9. A method as set forth in claim 6, wherein said isolation insulating layer forming step includes the steps of:
forming a silicate glass layer on said mask insulating layer, said sidewall insulating layer, and said semiconductor substrate within said groove;
forming a phosphorus-doped silicate glass layer on said silicate glass layer;
reflowing said phosphorus-doped silicate glass layer by a heat treatment; and
etching said silicate glass layer and said phosphorus-doped silicate glass layer, so that said first and second conductive layers are exposed.

10. A method as set forth in claim 6, wherein said third conductive layer is made of high melting temperature metal silicide.

* * * * *